(12) United States Patent
Feldbaum et al.

(10) Patent No.: US 9,809,887 B2
(45) Date of Patent: Nov. 7, 2017

(54) METHOD OF PATTERNING A STACK

(71) Applicant: Seagate Technology LLC, Cupertino, CA (US)

(72) Inventors: Michael R. Feldbaum, San Jose, CA (US); Justin Jia-Jen Hwu, Fremont, CA (US); David S. Kuo, Palo Alto, CA (US); Gennady Gauzner, San Jose, CA (US); Kim Yang Lee, Fremont, CA (US); Li-Ping Wang, Fremont, CA (US)

(73) Assignee: Seagate Technology LLC, Cupertino, CA (US)

(*) Notice: Subject to any disclaimer, the term of this patent is extended or adjusted under 35 U.S.C. 154(b) by 0 days.

(21) Appl. No.: 15/052,701

(22) Filed: Feb. 24, 2016

(65) Prior Publication Data

US 2016/0168723 A1    Jun. 16, 2016

Related U.S. Application Data

(63) Continuation of application No. 13/173,906, filed on Jun. 30, 2011, now Pat. No. 9,284,649.

(51) Int. Cl.

| | |
|---|---|
| *C23F 4/00* | (2006.01) |
| *B82Y 40/00* | (2011.01) |
| *B82Y 10/00* | (2011.01) |
| *G03F 7/00* | (2006.01) |
| *G11B 5/855* | (2006.01) |

(52) U.S. Cl.
CPC .............. *C23F 4/00* (2013.01); *B82Y 10/00* (2013.01); *B82Y 40/00* (2013.01); *G03F 7/0002* (2013.01); *G11B 5/855* (2013.01); *Y10T 428/265* (2015.01)

(58) Field of Classification Search
CPC . C23F 4/00; B82Y 40/00; B82Y 10/00; G03F 7/0002; G11B 5/855; Y10T 428/265
See application file for complete search history.

(56) References Cited

U.S. PATENT DOCUMENTS

| | | | |
|---|---|---|---|
| 5,658,470 A | 8/1997 | Schultz et al. | |
| 6,007,732 A | 12/1999 | Hashimoto et al. | |
| 7,488,429 B2 | 2/2009 | Okawa et al. | |
| 7,715,147 B2 | 5/2010 | Feldbaum et al. | |
| 7,743,487 B2 | 6/2010 | Baer et al. | |
| 7,967,993 B2 | 6/2011 | Isowaki et al. | |
| 8,178,223 B2 | 5/2012 | Takei et al. | |
| 2008/0078739 A1 | 4/2008 | Hibi et al. | |
| 2009/0207527 A1* | 8/2009 | Takei | B82Y 10/00 360/244 |
| 2010/0326819 A1* | 12/2010 | Lille | B82Y 10/00 204/192.34 |

OTHER PUBLICATIONS

Search Report and Written Opinion by the Intellectual Propery Office of Singapore dated Feb. 26, 2016 in SG Application No. 2014012660. 8 pages.

* cited by examiner

*Primary Examiner* — Anita Alanko

(57) ABSTRACT

The embodiments disclose a method of fabricating a stack, including replacing a metal layer of a stack imprint structure with an oxide layer, patterning the oxide layer stack using chemical etch processes to transfer the pattern image and cleaning etch residue from the stack imprint structure to substantially prevent contamination of the metal layers.

20 Claims, 9 Drawing Sheets

METHOD OF PATTERNING A STACK

RELATED APPLICATIONS

This application is a continuation and claims the benefit and priority to the U.S. application Ser. No. 13/173,906 filed on Jun. 30, 2011, entitled "Method of Patterning a Stack" which is hereby incorporated herein by reference in its entirety.

BACKGROUND

Contamination of the amorphous carbon layer during milling by residue of a metal mask may occur when using a metal sub-layer to transfer a pattern image from an imprinted resist to the magnetic layer. The residue of metal contaminates the amorphous carbon mask layer, resulting in affection of control dimensions bias and fidelity of patterning. Size and position control of features during a pattern fabrication process degrades drastically due to metallic residue mixed up with amorphous carbon mask layer residue left after stack patterning. Also, such a mixture is hard to clean up without affecting magnetic properties of the magnetic layer.

DETAILED DESCRIPTION OF THE INVENTION

In a following description, reference is made to the accompanying drawings, which form a part hereof, and in which is shown by way of illustration a specific example in which the invention may be practiced. It is to be understood that other embodiments may be utilized and structural changes may be made without departing from the scope of the present invention.

General Overview:

It should be noted that the descriptions that follow, for example, in terms of a method of patterning a stack is described for illustrative purposes and the underlying system can apply to any number and multiple types of layered imprint structures. In one embodiment the method of patterning a stack can be configured using a chemical application to de-scum the pattern imprinted resist layer. The method of patterning a stack can be configured to include multiple oxide compounds to deposit the oxide lay and can be configured to include multiple chemical elements or compounds to use in the chemical etching in the various layers to achieve high fidelity image transfer patterning of the stack using the present invention.

In the following descriptions chemical symbols are used where $O_2$ means oxygen gas; $CHF_3$ means trifluoromethane; Ar means argon gas, $SiO_2$ means silicon dioxide, $Ta_2O_5$ means tantalum pentoxide, $CF_4$ means tetrafluoromethane and $C_4F_8$ means octafluorocyclobutane. The following descriptions include processes and features including RIBE meaning reactive ion beam etching; IBE meaning ion beam etching, RIE meaning reactive ion etching, UV light meaning ultraviolet light, CD meaning Control Dimensions and PFP meaning Pattern Fabrication Process. The chemical symbols, process abbreviations and layer descriptions may be used interchangeably with their full text descriptions maintaining the same meaning.

Figure 1:
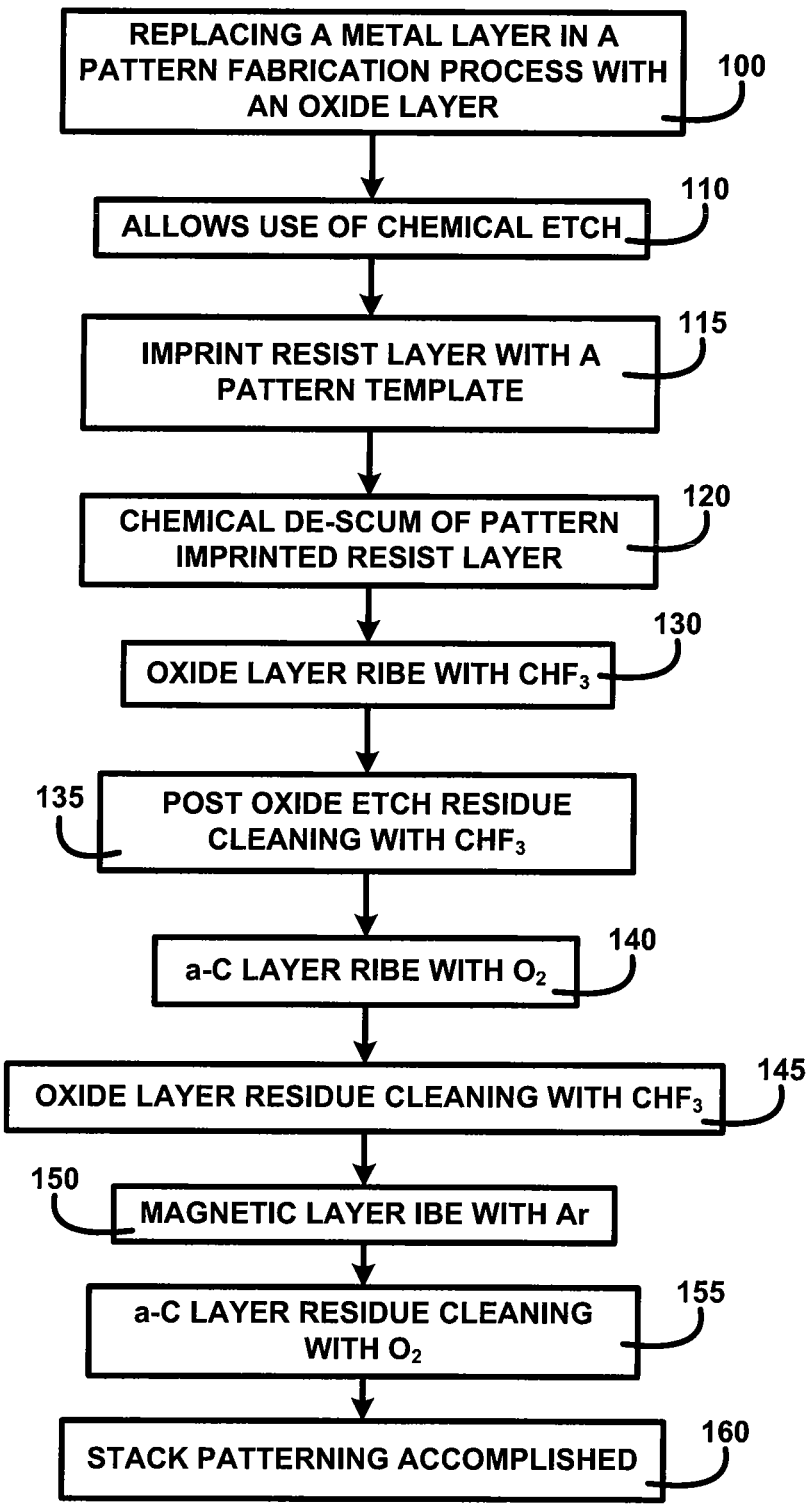
FIG. 1 shows a block diagram of an overview of a method of patterning a stack of one embodiment.

FIG. 1 shows a block diagram of an overview of a method of patterning a stack of one embodiment. FIG. 1 shows an overview of a method of image transfer using an oxide layer wherein replacing a metal layer in a pattern fabrication process with an oxide layer 100 prevents contaminating of the amorphous carbon layer during milling or etching. Chemical etching of the non-metallic oxide layer will prevent any metallic residue, which may result in increased bias and fidelity affection. The imprint layered structure with an oxide layer allows use of chemical etch 110 processes to pattern a stack of one embodiment.

The imprint layered structure with an oxide layer may include well-defined nanostructures of various thicknesses. The nanostructures provide well-defined topology, composition and functionality. Ion beams create chemical reactions using chemical gases injected into the beams which act as reactive agents for chemical etching of the imprint structure layers. The precisely positioned ion beam coupled with a chemical reactive agent may be used to remove surface structures with nanometer precision and in virtually any desired three-dimensional shapes of one embodiment.

The imprint structure layers include an imprint resist layer. A step to imprint resist layer with a pattern template 115 is processed after deposition of the resist layer. A template with for example a bit-patterned topography is placed on the resist layer. The template may be a mirrored topography that includes recesses. The recesses are filled in by the resist material through capillary action. The imprint resist layer may be configured to cure or harden when exposed to UV light. The template is removed after the UV light curing. The surface of the hardened resist layer has the pattern topography transferred by using the template of one embodiment.

After the imprint of the resist layer is completed and the template removed a residual layer (scum) is left on a top of the oxide layer. A scum on the surface of the imprint resist layer may harden more rapidly and cause ion beam deflections which may result in poorly defined underlying etched surfaces and structures. The method of patterning a stack allows a chemical de-scum of pattern imprinted resist layer 120 to be performed of one embodiment.

The chemical de-scum process is used to remove the residual layer (scum) left on top of the oxide layer. The post imprint scum has varying thicknesses from feature to feature (dot to dot) within the same magnetic stack or disk. The variations in scum thicknesses persist between the variations of one magnetic stack to another.

A result of scum thickness variations is the continual adjustments of the processing time during an oxide etching. A stack is processed using exposure in plasma during an oxide etch for a period of time. The depth of the milling or etch of the oxide layer is controlled by the duration of the exposure time. Inconsistent mill depths of the oxide layer due to scum thickness variations may result in the possibility of CD variation and incomplete milling of the oxide layer. The chemical de-scum of pattern imprinted resist layer 120 resolves the continual adjustments of the plasma exposure times caused by the scum thickness variations and increased possibility of CD variation and incomplete milling of the oxide layer. The chemical de-scum process using oxygen gas as a reactive agent may include a reactive ion beam etching process (RIBE) or Reactive Ion Etching (RIE). The removal of the resist layer scum using a chemical process is fast and cost effective of one embodiment.

The method of patterning a stack allows use of chemical etch 110 processes to pattern the remaining imprint layers. Chemical etching may include processes such as reactive ion beam etching. In one embodiment a step may include oxide layer RIBE with $CHF_3$ 130. In this step reactive ion beam etching may be used to etch or remove a portion of the oxide layer to create the pattern structure in the oxide layer. A chemical such as trifluoromethane ($CHF_3$) is used as a reactive agent. The ion beam is guided into the patterned areas to be removed and the $CHF_3$ gas is introduced to cause the portions of the oxide layer to be removed to react and vaporize. The reaction is controlled to remove only the oxide layer by the selection of the chemical reactive agent. The oxide layer is configured to include materials that are non-metallic and include materials wherein metals in the materials can be chemically etched to prevent metals from contaminating the amorphous carbon layer below. The chemical etching of the oxide layer is fast, cost effective and results in decreased control dimensions bias and fidelity affection of one embodiment.

The patterning process progresses from one layer to the underlying layer in steps. The previously patterned layer becomes the mask for the underlying layer. Residue of the materials from prior patterned layer creating a mask may be deposited on the underlying layer yet to be patterned. The chemical etching of the oxide layer may deposit residue on the underlying amorphous carbon layer of one embodiment.

A step is included in the method of high fidelity image transferring to pattern a stack that may include a post oxide etch residue cleaning with $CHF_3$ 135. The chemical etch for cleaning oxide layer residue from the amorphous carbon layer prior to the patterning process of the amorphous carbon layer. The post oxide etch residue cleaning with $CHF_3$ 135 is a short exposure time period that removes residue but leaves the oxide mask for use in patterning the amorphous carbon layer. The post patterning oxide layer residue cleaning process prevents residue from damaging the magnetic layer of one embodiment.

In one embodiment the next step may include using a chemical etching process to pattern the amorphous carbon layer. The chemical etching process may include an amorphous carbon layer RIBE with $O_2$ 140. The amorphous carbon layer is an amorphous carbon that reacts with oxygen gas. A reactive ion beam etching (RIBE) process wherein oxygen gas is introduced may be used to remove the portions of the amorphous carbon layer in the pattern configuration. The amorphous carbon layer is an adhesive layer that after a chemical etching process is used as a mask to pattern the magnetic layer of one embodiment.

An oxide layer residue cleaning with $CHF_3$ 145 is performed to remove any oxide layer etch residue and the oxide layer itself to avoid the contaminating of amorphous carbon with this residue during IBE of magnetic layer. The amorphous carbon has little or no reaction with the chemistry used in the oxide layer residue cleaning with $CHF_3$ 145. The result is a clean amorphous carbon layer and underlying magnetic layer surface free of residue materials used as a mask for amorphous carbon layer patterning such as oxide. Residue materials that remain may affect the magnetic layer patterning quality in following process steps. The plasma exposure used in the cleaning process would only affect surfaces in the layers that later would be milled away during magnetic layer patterning of one embodiment.

The next step includes a chemical or non-chemical (IBE) etch of the magnetic layer to embed the pattern to be transferred by the amorphous carbon layer mask. An ion mill process in one embodiment may be used to pattern the magnetic layer IBE with Ar 150. The ion milling with argon gas introduced creates a clean well-defined etch of the magnetic layer. The etching of the magnetic layer is followed by an amorphous carbon residue cleaning with $O_2$ 155. The amorphous carbon residue cleaning with $O_2$ 155 is a chemical removal of any residue on the magnetic layer that may remain after the patterning of magnetic layer. The amorphous carbon residue cleaning with $O_2$ 155 is the final step that leaves the magnetic layer free of any contamination from the Pattern Fabrication Process of one embodiment.

The magnetic layer is free of any contamination that may cause degradation or deterioration of the size and position of image features. The prevention of contamination prevents affecting Control Dimensions (CD) bias and the magnetic properties of the patterned stack. The stack patterning accomplished 160 using the method of patterning a stack provides a simple, cost effective and fast patterning of the stack with high fidelity of the image transferred and high quality throughput of one embodiment.

Figure 2A:
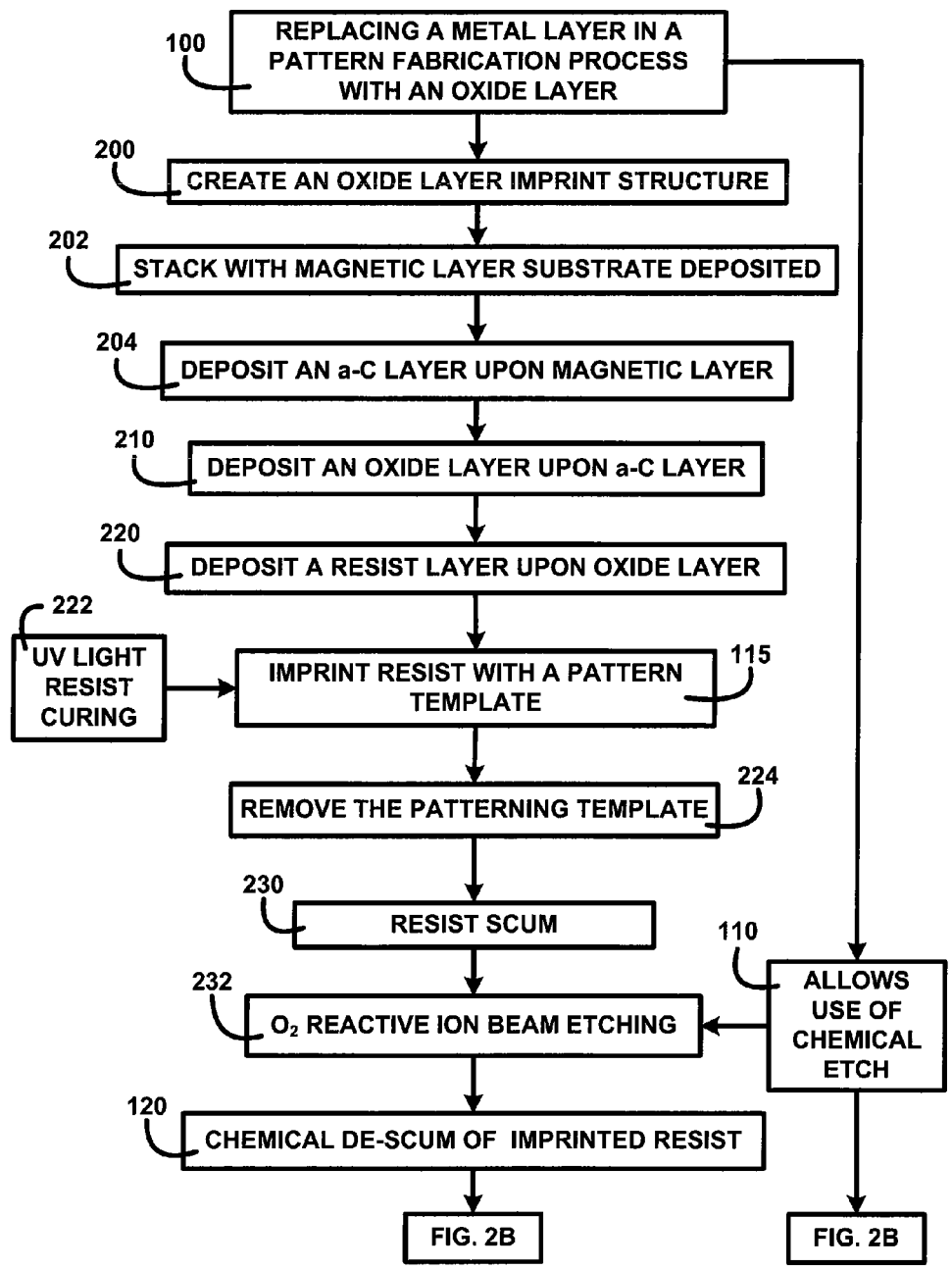
FIG. 2A shows a block diagram of an overview flow chart of a method of patterning a stack of one embodiment.

Detailed Description:

FIG. 2A shows a block diagram of an overview flow chart of a method of patterning a stack of one embodiment. FIG. 2 shows the method of image transfer using an oxide layer replacing a metal layer in a pattern fabrication process with an oxide layer 100. The replacement of a metal is used to create an oxide layer imprint structure 200. The creation of the oxide layer imprint structure begins with a stack with magnetic layer substrate deposited 202 of one embodiment.

The next step is to deposit an amorphous carbon layer upon magnetic layer 204. The amorphous carbon layer uses an amorphous carbon to create a hard mask that will be used to transfer the pattern image to the magnetic layer. The deposition of the amorphous carbon to form the amorphous carbon layer in one embodiment may be deposited in a thickness of 4-20 nm or more.

A step to deposit an oxide layer upon amorphous carbon layer 210 is the replacement of the metal layer. The thickness of the oxide layer may for example be deposited in a layer of 3 nm or more. The initial step to image transferring is to deposit a resist layer upon oxide layer 220. The resist layer may be created using a spin-coating process of one embodiment.

The next step to transfer the image is to imprint resist layer with a pattern template 115. The pattern template may include a pattern template fabricated for patterned stacks such as bit-patterned or discrete track media. The pattern template is placed on the resist layer with the pattern topography making contact with the resist material. The recesses of the pattern topography are filled with resist materials through capillary action. A UV light resist curing 222 hardens the resist layer including the filled recesses of one embodiment.

A step follows to remove the patterning template 224 by lifting the template off when the resist layer is cured. An imprinted resist material may develop an imprint resist scum 230 on the surface of the imprinted resist layer. A scum on the surface may interfere with the additional etching processes such as deflecting beam projections. The interference may cause incomplete etching and reduce the fidelity of the pattern image transfer. The method of patterning a stack allows use of chemical etch 110 processes. A step in one embodiment uses the chemical de-scum of pattern imprinted resist layer 120 of one embodiment.

In one embodiment a chemical etch process such as $O_2$ reactive ion beam etching 232 may be used to remove the imprint resist scum 230. The oxygen gas injected into the ion beam reacts with the imprint resist scum 230 to dissolve or vaporize the surface scum. The chemical de-scum process may include processes using oxygen gas as a reactive agent such as a reactive ion beam etching process (RIBE) and Reactive ion etch (RIE). The chemical de-scum of pattern imprinted resist layer 120 leaves the surface of the oxide layer free of resist scum 230 residue contamination in preparation for an image transfer to the oxide layer as shown in FIG. 2B of one embodiment.

Figure 2B:
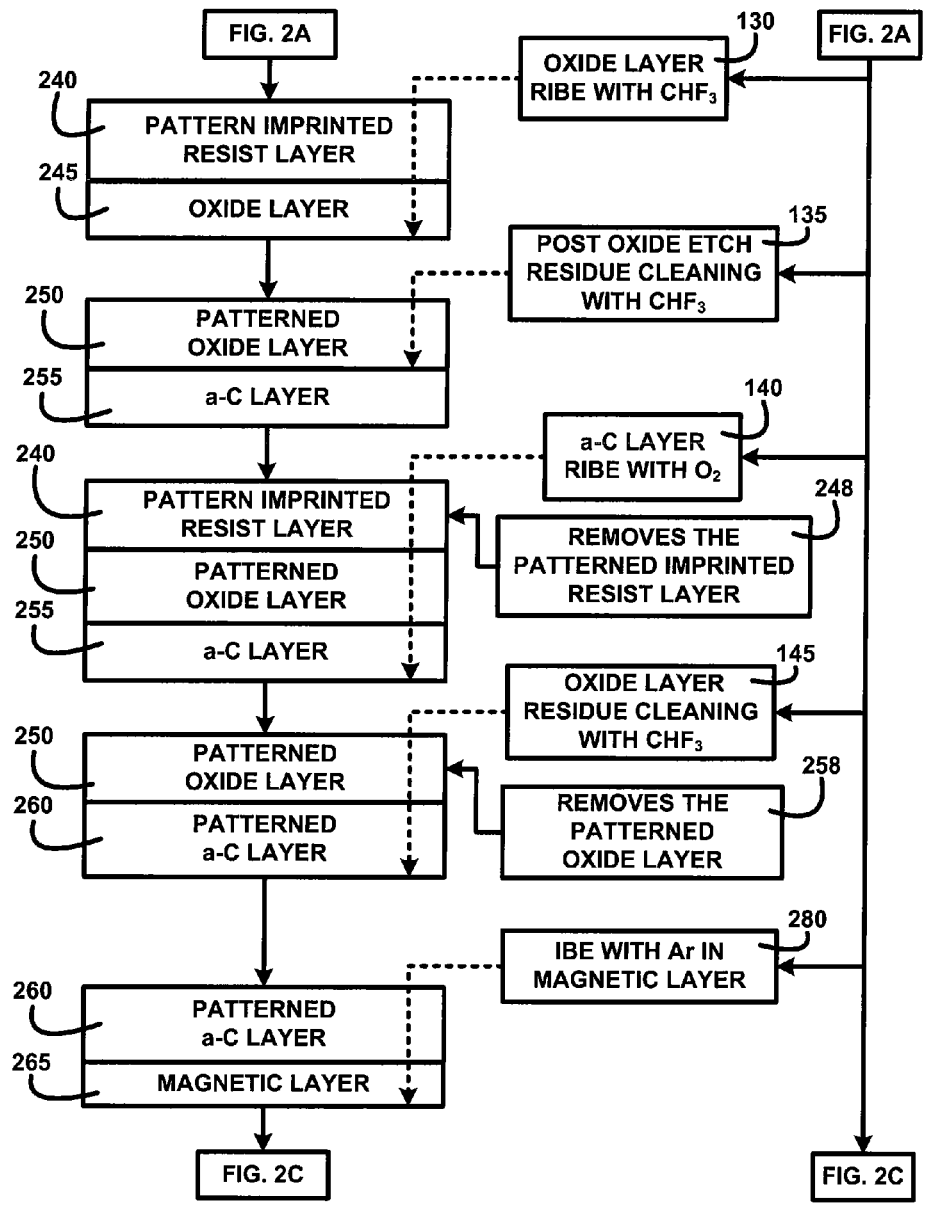
FIG. 2B shows a block diagram of a continuation of an overview flow chart of a method of patterning a stack of one embodiment.

Oxide Layer Image Transfer:

FIG. 2B shows a block diagram of a continuation of an overview flow chart of a method of patterning a stack of one embodiment. FIG. 2B shows a pattern imprinted resist layer 240 from FIG. 2A being used to transfer the image to an oxide layer 245. In one embodiment the oxide layer RIBE with $CHF_3$ 130 chemical etching process may be used to etch the oxide layer 245. The trifluoromethane is injected into the ion beam to provide a reactive ion beam etching of the oxide layer 245. The patterning of the oxide layer using trifluoromethane as a reactive agent may include chemical etch processes such as a reactive ion beam etching process (RIBE) and reactive ion etch (RIE) of one embodiment.

The chemical etch of the oxide layer 245 prevents contamination of the magnetic layer (isolated by amorphous carbon). Etching of amorphous carbon and Imprinted UV resist mask with chemistry chosen (CHF3) is insignificant (chemical reaction with amorphous carbon with CHF3 chemistry is very slow, compare to etching of $SiO_2$ layer, in one embodiment. In other embodiments the chemical etch of the oxide layer 245 may include the use of other chemistry for example CF4 or C4F8, with the same effect of one embodiment.

Oxide mask material, oxide beneath the imprinted resist, 245 may remain on the amorphous carbon layer 255. A post oxide etch residue cleaning with $CHF_3$ 135 step is included to remove this residue from the amorphous carbon layer 255 after chemical etch of the amorphous carbon layer 255. This step will prevent oxide materials from contaminating the magnetic layer 265. A short exposure time period during the post oxide etch residue cleaning with $CHF_3$ 135 step will remove the oxide residue deposits on the amorphous carbon layer 255 and leave the patterned oxide layer 250 intact. The oxide mask is used in patterning the amorphous carbon layer 255 of one embodiment.

A next step in one embodiment includes the amorphous carbon layer RIBE with $O_2$ 140 which may be performed in the amorphous carbon layer 255. The patterning of the amorphous carbon adhesive layer may include a chemical etch using oxygen gas as a reactive agent including a reactive ion beam etching process, or RIBE. The $O_2$ chemistry will remove the pattern imprinted resist layer 240 materials for example at an accelerated etch rate such as 5 times faster than the etch rate of the amorphous carbon during the patterning of the amorphous carbon layer 255. The accelerated etch of the resist materials removes the patterned imprinted resist layer 248 materials completely during etch of the amorphous carbon layer 255. The portions of the amorphous carbon layer 255 to be removed in the pattern design are dissolved or vaporized by the oxygen gas that is injected into the ion beam. The reactive ion beam etching of the amorphous carbon layer 255 results in high fidelity including size and position control in the pattern image transfer of one embodiment.

Etch of the patterned oxide layer 250 and patterned amorphous carbon layer 260 may leave oxide residue on the on patterned amorphous carbon layer (255). The oxide residue may poison the amorphous carbon layer 260 after the magnetic layer 265 patterning. An oxide layer residue cleaning with $CHF_3$ 145 is used to remove any oxide residue and also removes the patterned oxide layer 258. The oxide layer residue cleaning with $CHF_3$ 145 may include chemical etch process using CHF3 chemistry such as RIBE or RIE. The removal of the oxide materials leaves the magnetic layer 265 and remaining portion of amorphous carbon layer 255 free from contamination prior to the patterned layer magnetic layer 265 patterning processes of one embodiment.

Figure 2C:
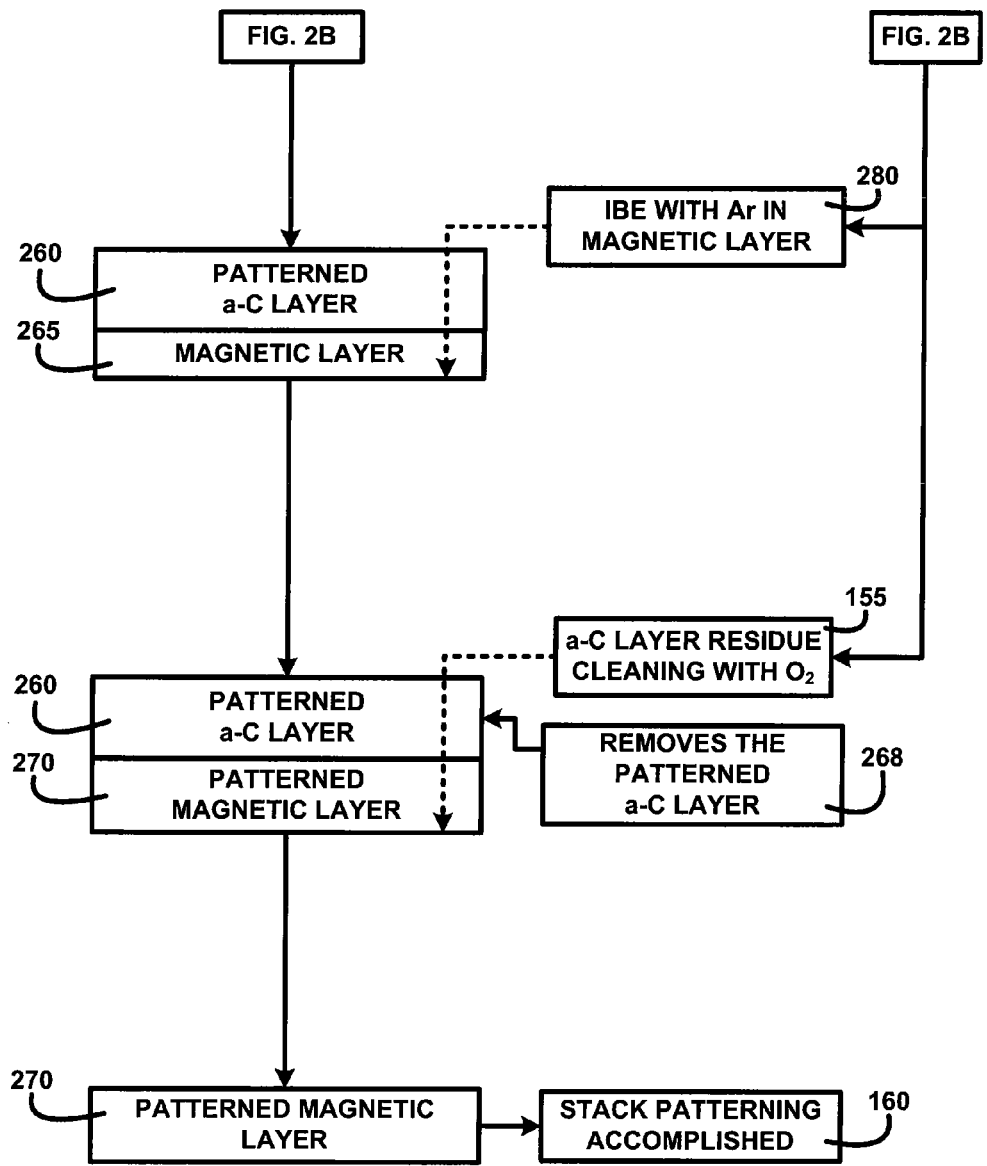
FIG. 2C shows a block diagram of a continuation of an overview flow chart of a method of patterning a stack of one embodiment.

Magnetic Layer Patterning:

FIG. 2C shows a block diagram of a continuation of an overview flow chart of a method of patterning a stack of one embodiment. FIG. 2C shows in one embodiment an etch process step in the magnetic layer 265. This step may include an IBE with Ar in magnetic layer 280 to transfer the pattern image using the patterned amorphous carbon layer 260 mask. The IBE in magnetic layer 280 may include using a non-chemical etch for example an ion mill or milling process such as an ion beam etching process using argon gas. The argon gas is injected into the ion beam. The injected Ar and ion beam act to dissolve or vaporize those portions of the magnetic layer 265 to be removed in the patterning image transfer. The IBE with Ar in magnetic layer 280 results in high fidelity of the image transfer of one embodiment.

A final step in the method of patterning a stack may include the amorphous carbon residue cleaning with $O_2$ 155. The amorphous carbon residue cleaning with $O_2$ 155 removes pattern imprinted amorphous carbon layer 268 and any amorphous carbon layer 255 residue deposited during the magnetic layer 265 etching process. The amorphous carbon residue cleaning with $O_2$ 155 using $O_2$ chemistry is easily accomplished since there is no contamination associated with metallic and/or Oxide residue mixed up with the amorphous carbon. The amorphous carbon residue cleaning with $O_2$ 155 leaves the surfaces of the patterned magnetic layer 270 free from contamination. This will leave the surface of stack or media clean of any residue, for the purpose of general stack or media use for example in hard drives to minimize the head/stack or media space losses incurred by any remaining residue. The stack patterning accomplished 160 provides high fidelity of the image transfer, high definition of the pattern and higher quality in the completed stacks of one embodiment.

The steps of the method of patterning a stack results in stack patterning accomplished 160 with simplicity and prevention of increased bias and pattern dislocation. The method of high fidelity image transferring to pattern a magnetic stack using an oxide layer allows chemical etch processes to transfer the pattern image with high fidelity in stack structures such as bit-patterned and discrete track media in a pattern fabrication process of one embodiment.

Figure 3A:
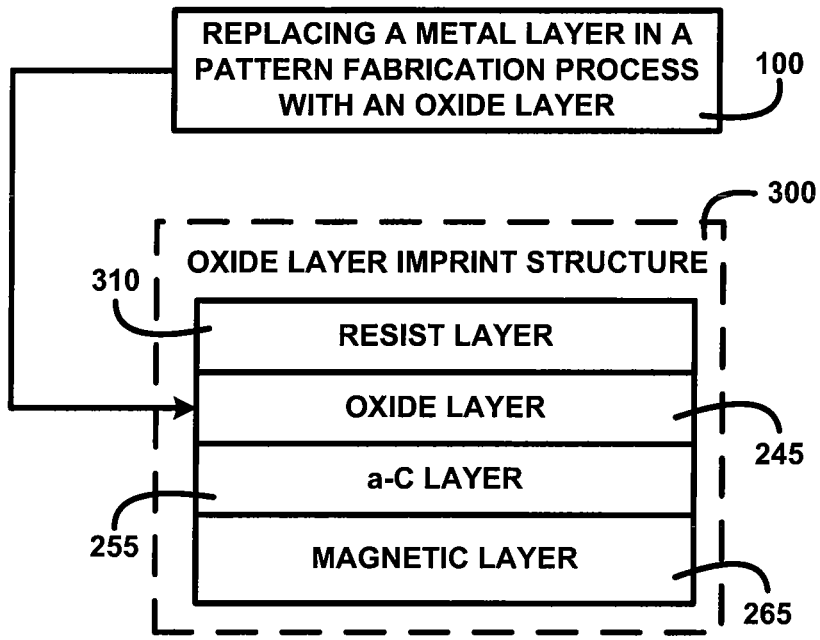
FIG. 3A shows for illustrative purposes only an example of an oxide layer imprint structure of one embodiment.

Oxide Layer Imprint Structure:

FIG. 3A shows for illustrative purposes only an example of an oxide layer imprint structure of one embodiment. FIG. 3A shows an oxide layer imprint structure 300 using the method of high fidelity image transferring to pattern a magnetic stack using an oxide layer for replacing a metal layer in a pattern fabrication process with an oxide layer 100. The oxide layer 245 has replaced a metal layer in a PFP. The oxide layer 245 may include a deposition thickness of the oxide layer such as 1-3 nm or more for example using compounds such as silicon dioxide ($SiO_2$) or Tantalum Pentoxide ($Ta_2O_5$). The compounds used to form the oxide layer 245 contain no metal. The non-metallic oxide layer is used to prevent contamination of the amorphous carbon layer 255 with un-deposited metallic residue. The oxide layer imprint structure 300 includes the imprint resist layer 310, the oxide layer 245, the amorphous carbon layer 255 and the magnetic layer 265 of one embodiment.

Figure 3B:
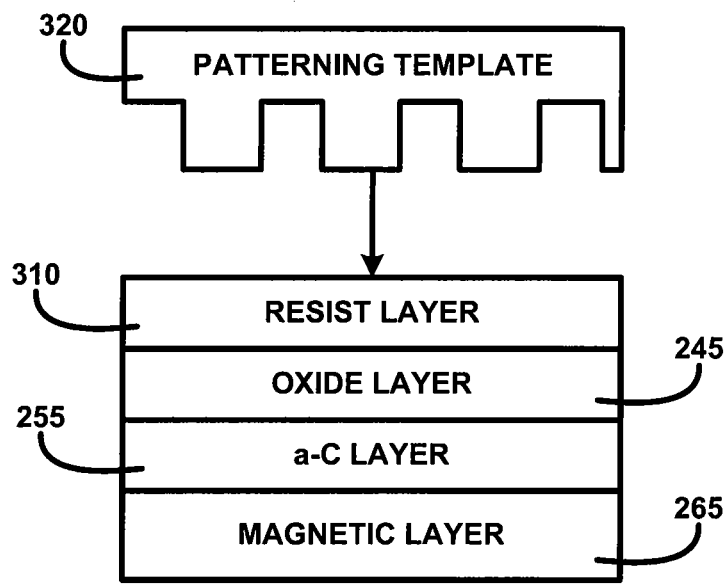
FIG. 3B shows for illustrative purposes only an example of template patterning in the resist layer of one embodiment.

Patterning Template:

FIG. 3B shows for illustrative purposes only an example of template patterning in the resist layer of one embodiment. FIG. 3B shows the placement or setting of the patterning template 320 on the resist layer 310 of a stack being fabricated. The patterning template 320 illustrates the reverse image of the pattern design. Recesses from the bottom surface of the patterning template 320 will be used to form domain trenches after the patterning is completed. The projections toward the bottom of the patterning template 320 will form islands or tracks in a patterned stack such as a bit-patterned or discrete track stack. The chemical etch processes allowed by the method of patterning a stack will be used to etch the pattern in the oxide layer 245, amorphous carbon layer 255 and magnetic layer 265 of one embodiment.

Figure 4A:
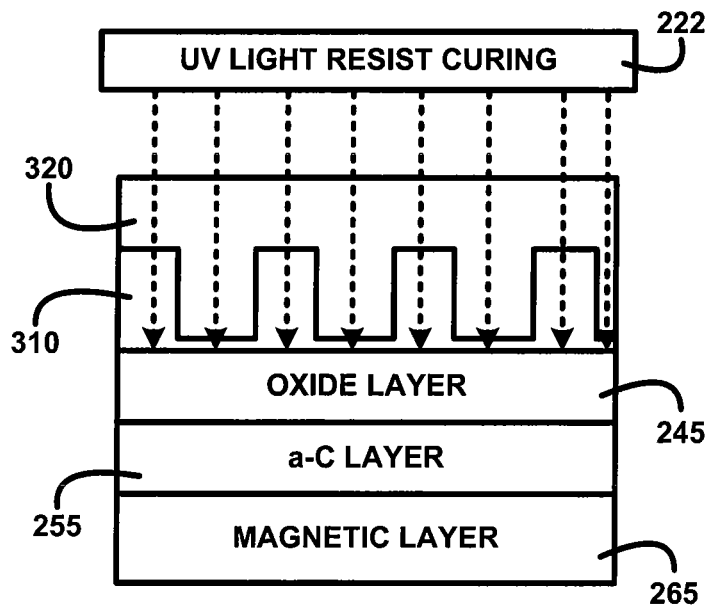
FIG. 4A shows for illustrative purposes only an example of UV light resist curing of the resist layer of one embodiment.

Resist Layer UV Light Curing:

FIG. 4A shows for illustrative purposes only an example of UV light resist curing of the resist layer of one embodiment. FIG. 4A shows the patterning template 320 after being set into place on the imprint layers structure 200 of FIG. 2. The imprint resist layer 310 materials have flowed through capillary action into the recesses of the patterning template 320 to fill the voids. In one embodiment the imprint resist layer 310 materials may be a spin-coated resist in a layer thickness of for example 30 nm or more. The imprint resist layer 310 layer thickness will be changed through the placement of the patterning template 320. The areas of the imprint resist layer 310 will be thin where the template projections are closest to the oxide layer 245, amorphous carbon layer 255 and magnetic layer 265. The filled recesses will be thicker. A process such as UV light resist curing 222 may be used to harden the imprint resist layer 310 materials. The cured imprint resist layer 310 materials will retain the reverse topography of the patterning template 320 of one embodiment.

Figure 4B:
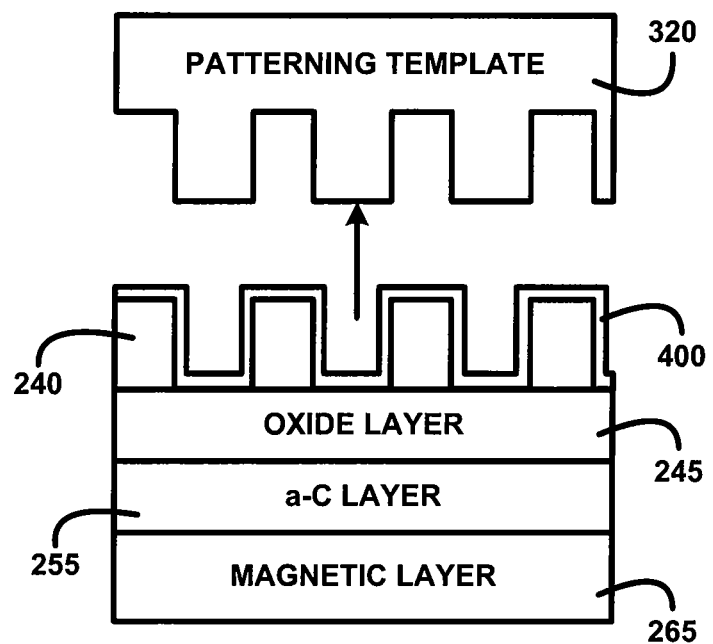
FIG. 4B shows for illustrative purposes only an example of removing the pattern template from the resist layer of one embodiment.

Removing a Patterning Template:

FIG. 4B shows for illustrative purposes only an example of removing the pattern template from the resist layer of one embodiment. FIG. 4B shows the removal of the patterning template 320 from the cured resist materials. The oxide layer 245 also provides high adhesion of the resist layer. The high adhesion generates a clean resist peel or removal of the template after UV irradiation of the resist layer. The patterning template 320 is lifted off to reveal the pattern imprinted resist layer 240. The pattern imprinted resist layer 240 may develop a resist scum 400 on the surface after the patterning template 320 is removed. The oxide layer 245, amorphous carbon layer 255 and magnetic layer 265 will be patterned through other processes of one embodiment.

Figure 5A:
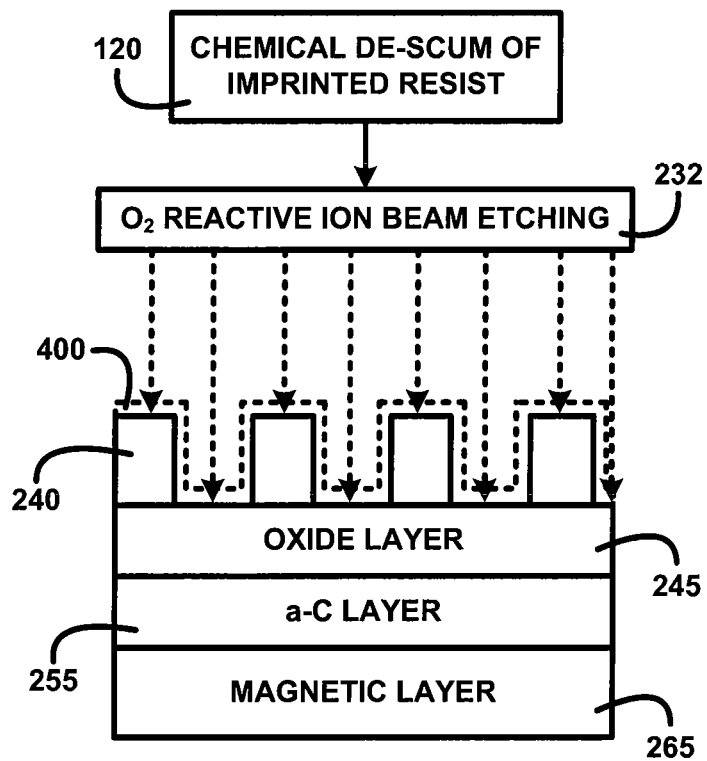
FIG. 5A shows for illustrative purposes only an example of a chemical de-scum of the pattern imprinted resist layer of one embodiment.

Chemical De-Scum:

FIG. 5A shows for illustrative purposes only an example of a chemical de-scum of the pattern imprinted resist layer of one embodiment. Chemical processes may be used in the method of patterning a stack for etching and other removals of layered materials. One such chemical process in one embodiment is the chemical de-scum of pattern imprinted resist layer 120. A chemical de-scum of pattern imprinted resist layer 120 may include a process such as a reactive ion beam etching process using oxygen gas as a reactive agent.

The scum that may develop on the surface of the pattern imprinted resist layer 240 materials may cause irregularities in the projection of ion beams used in etching the various layers. These irregularities may include deflection of the ion beam path. The deflections may for example prevent materials from being removed within the pattern design or cause the removal of materials outside the pattern boundaries. These layer materials removal irregularities may interfere with the proper functioning of the patterned layers.

In one embodiment a process such as $O_2$ reactive ion beam etching 232 is used for removal of the resist scum 400. Injected oxygen gas in concert with the ion beam will dissolve or vaporize the scum on the surface of the pattern imprinted resist layer 240. A small portion of the pattern imprinted resist layer 240 may be removed to assure full removal of the resist scum 400. The $O_2$ reactive ion beam etching 232 prevents affecting the oxide layer 245, amorphous carbon layer 255 or magnetic layer 265 of one embodiment, it only does a chemical etch of thin resist scum 400 layer of pattern imprinted resist layer 240.

Figure 5B:
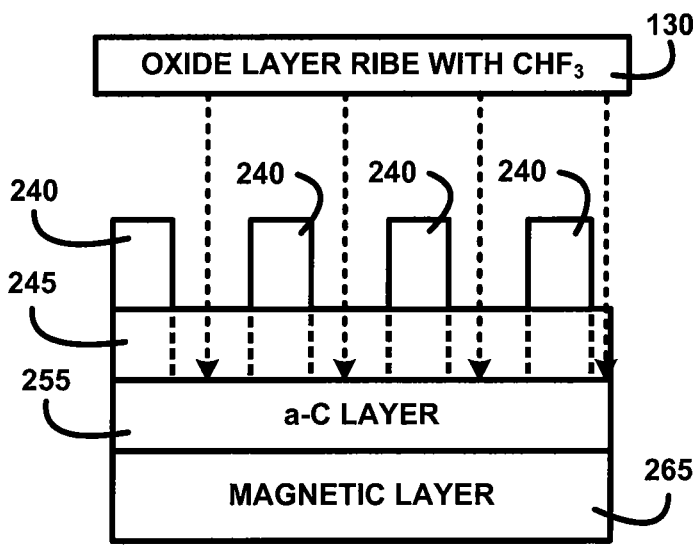
FIG. 5B shows for illustrative purposes only an example of an etching in the oxide layer of one embodiment.

Chemical Etching of the Oxide Layer:

FIG. 5B shows for illustrative purposes only an example of an etching in the oxide layer of one embodiment. The chemical etch of the oxide layer 245 prevents contamination of the amorphous carbon layer 255 with un-deposited metal that would create increased bias. The pattern imprinted resist layer 240 is used as a mask to pattern the oxide layer 245. A chemical etch such as a reactive ion beam etching process using chemistry such as trifluoromethane ($CHF_3$), tetrafluoromethane ($CF_4$) or octafluorocyclobutane ($C_4F_8$) as a reactive agent may for example etch the oxide layer fast, while etching of the amorphous carbon layer 255 is suppressed of one embodiment.

The oxide layer 245 in one embodiment may be etched using the oxide layer RIBE with $CHF_3$ 130 which allows use of chemical etch 110 of FIG. 1 processes. The trifluoromethane is introduced near the ion beam projections to react with the oxide layer 245. The chemical reaction dissolves or vaporizes those portions of the thin oxide layer 245 in the pattern designed areas. The oxide layer RIBE with $CHF_3$ 130 prevents removal of the amorphous carbon layer 255 or magnetic layer 265. The chemical etching process creates a pattern image transfer with high fidelity. No metal is included in the oxide layer 245. The oxide layer RIBE with $CHF_3$ 130 prevents leaving any un-deposited metal to affect bias of one embodiment. The patterned oxide layer 245 forms a mask for patterning the amorphous carbon layer 255 in the next step, using a chemical etch.

Figure 6A:
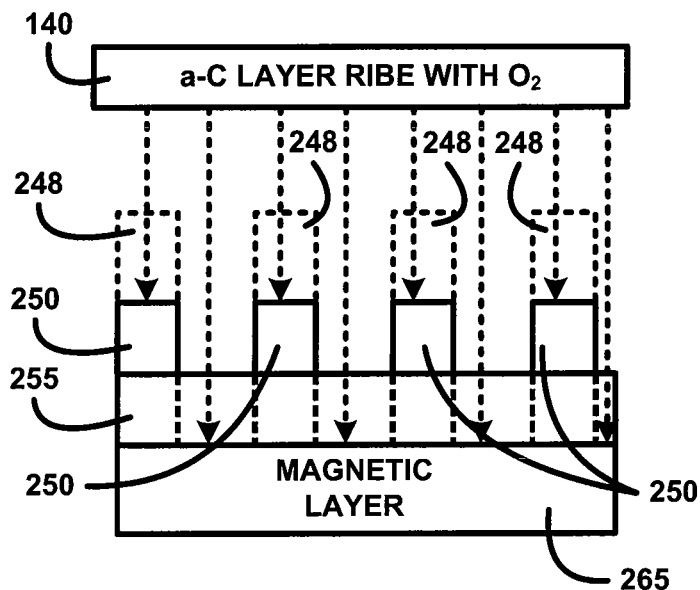
FIG. 6A shows for illustrative purposes only an example of an etching in the amorphous carbon layer of one embodiment.

Chemical Etching of the Amorphous Carbon Layer:

FIG. 6A shows for illustrative purposes only an example of an etching in the amorphous carbon layer of one embodiment. FIG. 6A shows a pattern imprinted resist layer 240 of FIG. 2B and a patterned oxide layer 250 after the chemical etching process. In one embodiment the next step is to pattern the amorphous carbon layer 255. The method of patterning a stack allows a chemical etch such as the amorphous carbon layer RIBE with $O_2$ 140. The patterning of the amorphous carbon layer 255 may include a chemical etch using oxygen gas as a reactive agent such as a reactive ion beam etching process. The reactive agent, oxygen gas, is injected into the area to be etched. The precisely focused ion beam causes chemical reaction between the $O_2$ and the amorphous carbon layer 255 materials and removes the patterned imprinted resist layer 248. The amorphous carbon layer 255 materials to be removed in accordance with the pattern design are dissolved or vaporized in the chemical reaction. The oxygen reactive ion beam etching of the amorphous carbon layer 255 materials prevents affecting the magnetic layer 265. The resulting etch of the amorphous carbon layer 255 is clean, fast, cost effective and is providing high fidelity of the pattern image transfer of in one embodiment. Removal of resist mask residue 248 at this point will leave Oxide mask residue with no protection. It will allow of cleaning oxide residue in the next step.

Figure 6B:
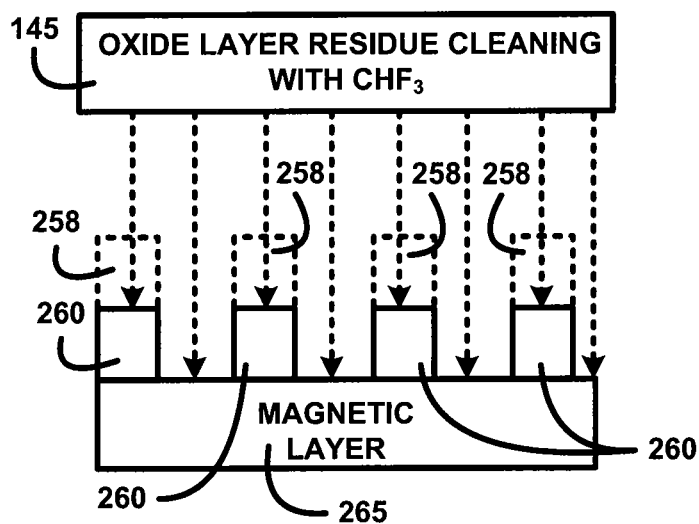
FIG. 6B shows for illustrative purposes only an example of an oxide layer residue cleaning of one embodiment.

Oxide Layer Residue Cleaning:

FIG. 6B shows for illustrative purposes only an example of an oxide layer residue cleaning of one embodiment. FIG. 6B shows the patterned amorphous carbon layer 260. An oxide layer residue cleaning with $CHF_3$ 145 may be used to remove any oxide layer residue and removes the patterned oxide layer 258. The oxide layer residue cleaning with $CHF_3$ 145 may include a chemical etch process using $CHF_3$ chemistry with RIE or RIBE which is etching the oxide materials fast, while almost no etching of the amorphous carbon layer materials occurs. The oxide layer residue cleaning with $CHF_3$ 145 leaves the patterned amorphous carbon layer 260 and the magnetic layer 265 free from any contamination from oxide residue from the patterned oxide layer 250 of FIG. 2B.

Figure 7A:
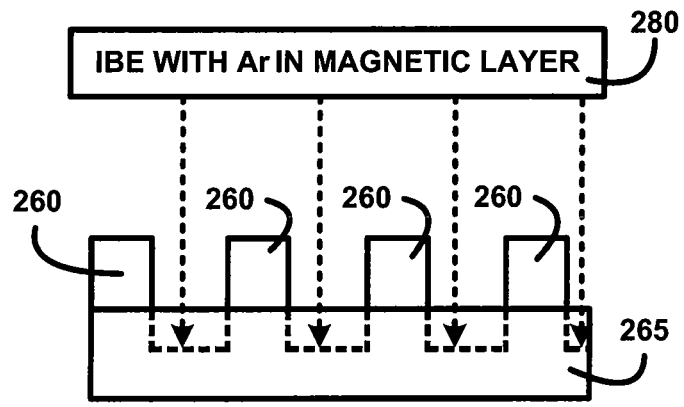
FIG. 7A shows for illustrative purposes only an example of an etching in the magnetic layer of one embodiment.

Etching of the Magnetic Layer:

FIG. 7A shows for illustrative purposes only an example of an etching in the magnetic layer of one embodiment. FIG. 7A shows the patterned amorphous carbon layer 260 being used as the pattern mask for the IBE with Ar in magnetic layer 280. This mill process of patterning the magnetic layer 265 may include sputter-etch such as an ion beam etching process using argon gas as an agent to pattern the magnetic layer. Argon is one of the noble gases, is stable and resists bonding with other elements. The argon gas is injected into the ion beam and the magnetic layer 265 materials to be removed according to the pattern design are dissolved or vaporized in the process. The exposure time and intensity of the precisely guided focused ion beam can be controlled to accurately set the depth of the etching in one embodiment.

Figure 7B:
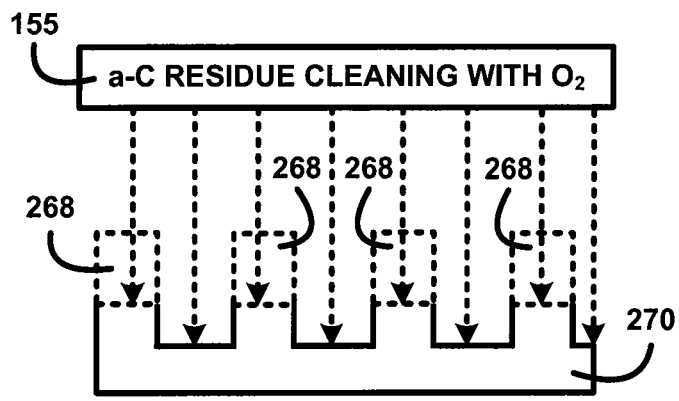
FIG. 7B shows for illustrative purposes only an example of an amorphous carbon layer residue cleaning of one embodiment.

Amorphous Carbon Layer Residue Cleaning:

FIG. 7B shows for illustrative purposes only an example of an amorphous carbon layer residue cleaning of one embodiment. FIG. 7B shows the amorphous carbon residue cleaning with $O_2$ 155 and may include the use of other gases, or their mixture using processes such as RIE or RIBE with oxygen gas as a reactive agent. The $O_2$ chemistry easily etches the patterned amorphous carbon layer 260 of FIG. 2C and any residue from the patterned amorphous carbon layer 260 of FIG. 2C milling processes. The $O_2$ chemistry has insignificant affect on the patterned magnetic layer 270. The amorphous carbon residue cleaning with $O_2$ 155 removes the patterned amorphous carbon layer 268 and any amorphous carbon layer 255 of FIG. 2B patterning residue resulting in the patterned magnetic layer 270 being free from contamination.

Figure 7C:
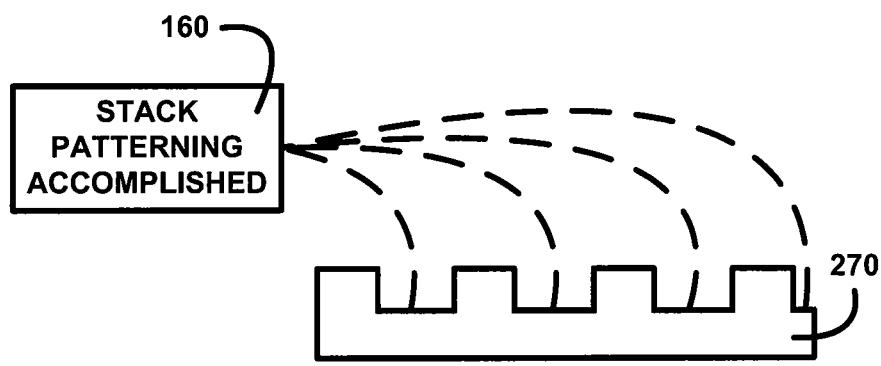
FIG. 7C shows for illustrative purposes only an example of a high fidelity image transfer to the magnetic layer of a stack of one embodiment.

High Fidelity Image Transfer Patterned Stack:

FIG. 7C shows for illustrative purposes only an example of a high fidelity image transfer to the magnetic layer of a stack of one embodiment. FIG. 7C shows the patterned magnetic layer 270 of a stack. The patterned magnetic layer 270 is free of contamination from residue produced in the milling of the other layers. The stack patterning accomplished 160 using the oxide layer imprint structure 300 of FIG. 3A produces the high fidelity image transfer in a PFP used for example for bit-patterned and discrete track media of one embodiment.

The foregoing has described the principles, embodiments and modes of operation of the present invention. However, the invention should not be construed as being limited to the particular embodiments discussed. The above described embodiments should be regarded as illustrative rather than restrictive, and it should be appreciated that variations may be made in those embodiments by workers skilled in the art without departing from the scope of the present invention as defined by the following claims.

What is claimed is:

1. A method comprising:
    patterning a resist layer disposed over an oxide layer to form a plurality features associated with a bit-patterned medium;
    etching a portion of the oxide layer that is not a layer within the formed plurality of features to expose an amorphous carbon layer disposed underneath the oxide layer;
    etching the resist layer of the formed plurality of features and the exposed amorphous carbon layer, wherein the etching the resist layer of the formed plurality of features exposes the oxide layer disposed underneath the resist layer of the formed plurality of features, and wherein the etching the exposed amorphous carbon layer exposes a magnetic layer disposed underneath the amorphous carbon layer; and
    etching the exposed magnetic layer to form a patterned magnetic layer.

2. The method of claim 1 further comprising:
    cleaning the exposed oxide layer to expose the amorphous carbon layer disposed underneath the exposed oxide layer.

3. The method of claim 2 further comprising:
    subsequent to cleaning the exposed oxide layer, cleaning the exposed amorphous carbon layer disposed underneath the exposed oxide layer.

4. The method of claim 1 further comprising:
    subsequent to the patterning the resist layer, removing resist scum using O2 reactive ion beam etching.

5. The method of claim 1, wherein the patterned resist layer masks a portion of the oxide layer during the etching of the portion of the oxide layer.

6. The method of claim 1, wherein the oxide layer prevents metallic-residue contamination of the amorphous carbon layer during patterning.

7. The method of claim 1, wherein the oxide layer is susceptible to fluorine-bearing gas etching conditions, wherein the fluorine-bearing gas is selected from CHF3, CF4, and C4F8.

8. The method of claim 1, wherein the oxide layer comprises an oxide selected from Ta2O5 and SiO2.

9. A method comprising:
   patterning a resist layer disposed over an oxide layer, wherein the oxide layer is disposed over an amorphous carbon layer, and wherein the amorphous carbon layer is disposed over a magnetic layer, wherein the patterning forms a plurality features associated with a bit-patterned medium;
   etching a portion of the resist layer;
   subsequent to the etching the portion of the resist layer, etching a remainder of the resist and a portion of the oxide layer; and
   subsequent to etching the remainder of the resist and the portion of the oxide layer, etching a portion of the amorphous carbon layer and the magnetic layer to form the plurality of features associated with the bit-patterned medium on the magnetic layer.

10. The method of claim 9, wherein the iteratively etching comprises:
    etching a portion of the oxide layer that is not a layer within the formed plurality of features to expose an amorphous carbon layer disposed underneath the oxide layer.

11. The method of claim 9, wherein the iteratively etching comprises:
    etching the resist layer of the formed plurality of features and the exposed amorphous carbon layer, wherein the etching the resist layer of the formed plurality of features exposes the oxide layer disposed underneath the resist layer of the formed plurality of features, and wherein the etching the exposed amorphous carbon layer exposes a magnetic layer disposed underneath the amorphous carbon layer.

12. The method of claim 11 further comprising:
    cleaning the exposed oxide layer to expose the amorphous carbon layer disposed underneath the exposed oxide layer.

13. The method of claim 10 further comprising:
    cleaning the exposed amorphous carbon layer disposed underneath an exposed oxide layer.

14. The method of claim 9 further comprising:
    subsequent to the patterning the resist layer, removing resist scum using O2 reactive ion beam etching.

15. The method of claim 9, wherein the resist layer, the oxide layer, the amorphous carbon layer, each forms a mask for a layer directly disposed underneath during the iterative etching process.

16. The method of claim 9, wherein the oxide layer prevents metallic-residue contamination of the amorphous carbon layer during patterning.

17. A method comprising:
    forming an amorphous carbon layer over a magnetic layer;
    forming an oxide layer over the amorphous carbon layer;
    forming a resist layer over the oxide layer;
    patterning the resist layer to form a plurality features associated with a bit-patterned medium;
    etching a portion of the oxide layer that is not a layer within the formed plurality of features to expose the amorphous carbon layer disposed underneath the oxide layer;
    etching the resist layer of the formed plurality of features and the exposed amorphous carbon layer, wherein the etching the resist layer of the formed plurality of features exposes the oxide layer disposed underneath the resist layer of the formed plurality of features, and wherein the etching the exposed amorphous carbon layer exposes a magnetic layer disposed underneath the amorphous carbon layer; and
    etching the exposed magnetic layer to form a patterned magnetic layer.

18. The method of claim 17 further comprising:
    cleaning the exposed oxide layer to expose the amorphous carbon layer disposed underneath the exposed oxide layer.

19. The method of claim 18 further comprising:
    subsequent to cleaning the exposed oxide layer, cleaning the exposed amorphous carbon layer disposed underneath the exposed oxide layer.

20. The method of claim 17, wherein the oxide layer prevents metallic-residue contamination of the amorphous carbon layer during patterning.

* * * * *